United States Patent
Goldman

(10) Patent No.: US 8,686,799 B2
(45) Date of Patent: Apr. 1, 2014

(54) LOW NOISE WIDE RANGE VOLTAGE-CONTROLLED OSCILLATOR WITH TRANSISTOR FEEDBACK

(75) Inventor: Stanley J. Goldman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1437 days.

(21) Appl. No.: 11/968,082

(22) Filed: Dec. 31, 2007

(65) Prior Publication Data
US 2009/0167442 A1 Jul. 2, 2009

(51) Int. Cl.
*H03K 3/03* (2006.01)
(52) U.S. Cl.
USPC .......................................... 331/57; 331/185
(58) Field of Classification Search
USPC ........................................ 331/57, 185, 186
See application file for complete search history.

(56) References Cited

U.S. PATENT DOCUMENTS

| 5,442,325 | A | | 8/1995 | Bosshart | |
|---|---|---|---|---|---|
| 5,465,075 | A | | 11/1995 | Yaklin | |
| 5,666,088 | A | * | 9/1997 | Penza | 331/34 |
| 5,963,102 | A | * | 10/1999 | Pang | 331/57 |
| 6,323,738 | B1 | * | 11/2001 | Yoshizawa et al. | 331/57 |

* cited by examiner

*Primary Examiner* — Joseph Chang
(74) *Attorney, Agent, or Firm* — Ronald O. Neerings; Wade James Brady; Frederick J. Telecky, Jr.

(57) ABSTRACT

An integrated circuit, a voltage controlled oscillator (VCO) and a phase-locked loop (PLL). In one embodiment, the VCO includes: (1) a voltage tune line configured to receive a tuning voltage for the VCO and (2) an odd number of ring-coupled delay elements. Each of the delay elements includes: (2A) an inverter having a power supply line being coupled to the voltage tune line and (2B) a feedback path having a gain-attenuating transistor with a gate thereof being coupled to the voltage tune line.

21 Claims, 3 Drawing Sheets

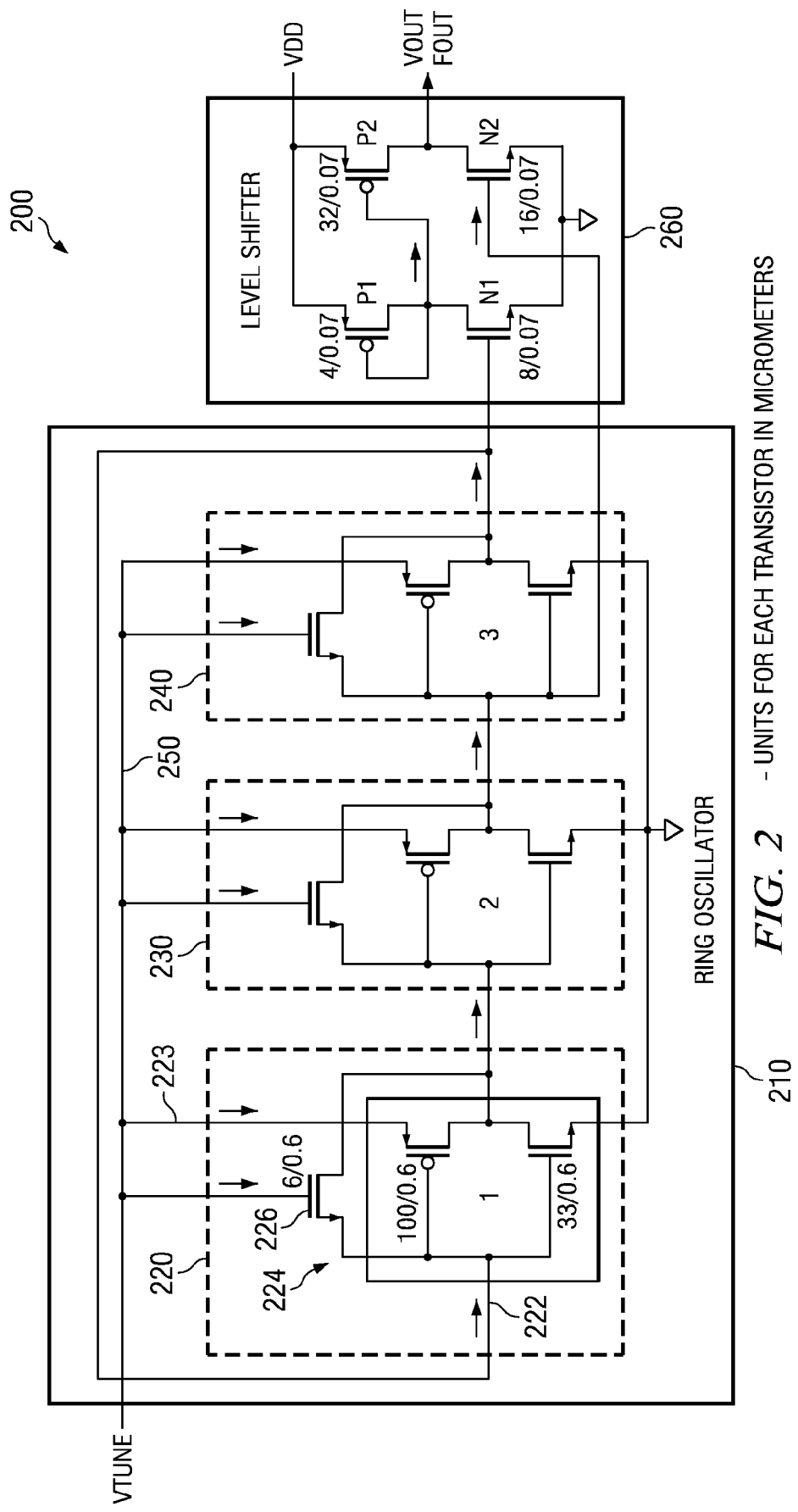
FIG. 2 — UNITS FOR EACH TRANSISTOR IN MICROMETERS

LOW NOISE WIDE RANGE VOLTAGE-CONTROLLED OSCILLATOR WITH TRANSISTOR FEEDBACK

TECHNICAL FIELD OF THE DISCLOSURE

The disclosure is directed, in general, to oscillators and, more specifically, to a voltage-controlled oscillator (VCO) having a broader operating range and reduced noise.

BACKGROUND OF THE DISCLOSURE

A phase-locked loop (PLL) is often used to generate clock signals. As well known in the art, a PLL is an electronic circuit that oscillates at a desired frequency and automatically adjusts the phase of its oscillation to match (lock on) that of an input signal. The PLL includes an oscillator, which is often a voltage-controlled oscillator (VCO). A VCO typically includes inverters configured in a ring. An odd number of inverters are needed to oscillate.

In addition to the VCO, a conventional PLL may include a phase/frequency detector to convert a phase difference to a pulse-width-modulated (PWM) error signal, a charge pump and lag lead loop filter to convert the phase error to a control voltage and a buffer amplifier that converts the high impedance control voltage (or tuning voltage) to a low impedance drive for a VCO tune line. The VCO converts the control voltage to an output phase. A programmable frequency divider at the VCO output feeds the divided-down VCO phase back to the phase detector input to complete the loop.

In general, a PLL operates by converting a pulsed error voltage to a DC voltage that is used to control the VCO. This DC control voltage causes the VCO to slightly change the output signal of the VCO in a direction that reduces the phase difference and also the frequency difference between the input and output signals. This error correcting cycle is repeated for each reference frequency cycle period, ultimately resulting in a minimum difference between the two frequencies. The phase-locked loop is described as "locked" when the phase difference between the two signals has stabilized.

PLLs are often manufactured in silicon. As processing nodes for silicon manufacturing continue to get smaller, the power supply voltage available to the PLLs is reduced and the associated noise levels are increased. At the same time, however, many applications employing PLLs (e.g., analog-to-digital converters), are requiring an increased signal-to-noise ratio and operating frequency range. To achieve these requirements, improved oscillators with a broader operating range and reduced noise are needed in the art.

SUMMARY OF THE DISCLOSURE

To address the above-discussed deficiencies of the prior art, the disclosure provides in one aspect, a PLL. In one embodiment, the PLL includes: (1) a phase detector configured to generate an error signal based on a reference frequency and an output frequency of the PLL, (2) a voltage tuner configured to receive the error signal and generate a tuning voltage and (3) a VCO configured to provide the output frequency. The VCO includes: (3A) a voltage tune line configured to receive the tuning voltage and (3B) ring-coupled delay elements, with each delay element including a feedback path having a gain-attenuating transistor with a gate thereof being coupled to the voltage tune line.

In another aspect, the disclosure provides a VCO. In one embodiment, the VCO includes: (1) a voltage tune line configured to receive a tuning voltage for the VCO and (2) an odd number of ring-coupled delay elements. Each of the delay elements includes: (2A) an inverter having a power supply line being coupled to the voltage tune line and (2B) a feedback path having a gain-attenuating transistor with a gate thereof being coupled to the voltage tune line.

In yet another aspect, the disclosure provides an integrated circuit. In one embodiment, the integrated circuit includes: (1) an input port configured to receive an input signal, (2) logic circuitry configured to process the input signal and generate an output signal, (3) an output port configured to provide an external interface for the output signal and (4) a phase-locked loop configured to generate a clock signal for the logic circuitry. The phase-locked loop has a voltage controlled oscillator (VCO), including: a voltage tune line configured to receive a tuning voltage for the VCO and ring-coupled delay elements, each including a feedback path having a gain-attenuating transistor with a gate thereof being coupled to the voltage tune line.

BRIEF DESCRIPTION OF THE DRAWINGS

For a more complete understanding of the disclosure, reference is now made to the following descriptions taken in conjunction with the accompanying drawings, in which:

FIG. 2 illustrates a schematic diagram of an embodiment of a VCO constructed according to the principles of the disclosure;

DETAILED DESCRIPTION

Figure 1:
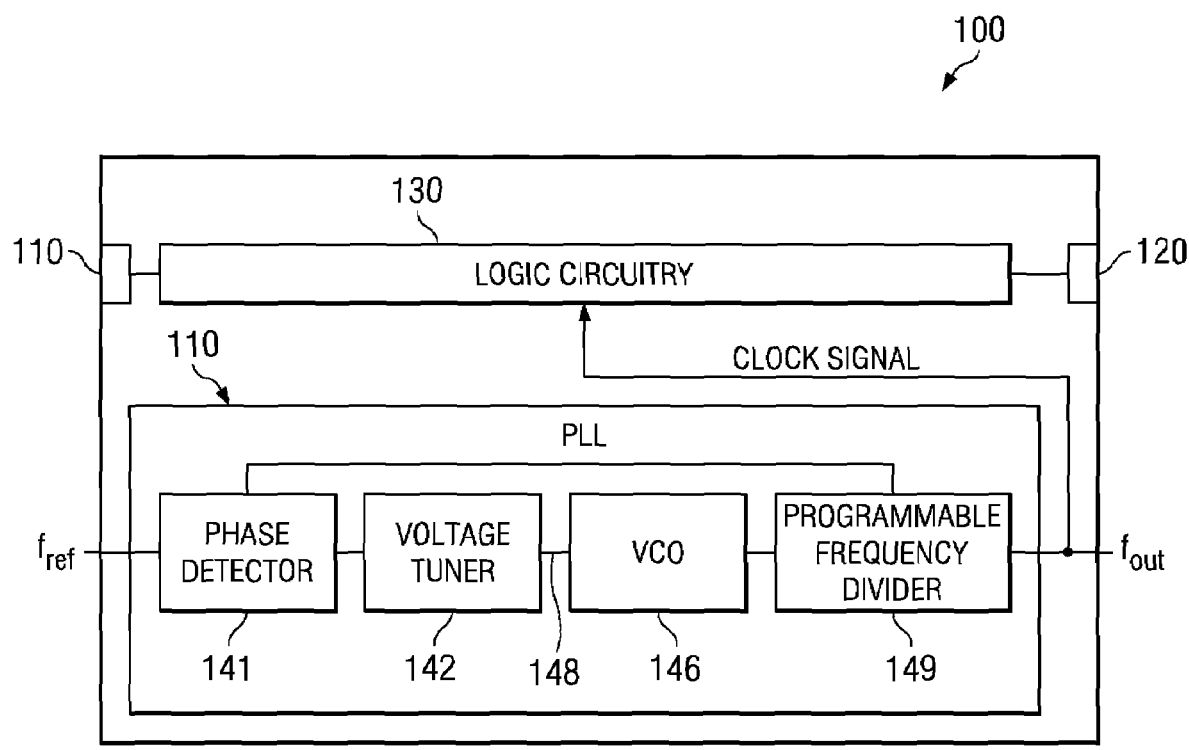
FIG. 1 illustrates a block diagram of an embodiment of an integrated circuit including a PLL having a VCO constructed according to the principles of the disclosure.

FIG. 1 illustrates an embodiment of an integrated circuit (IC) 100 constructed according to the principles of the disclosure. The IC 100 includes an input port 110, logic circuitry 120, an output port 130 and a PLL 140. The IC 100 may include additional components or circuitry typically included in an IC that are not illustrated or discussed for simplicity. For example, the IC 100 may include a port configured to receive a power supply voltage.

The input port 110 and the output port 130 may be conventional ports configured to receive an input signal and provide an external interface for an output signal, respectively. The logic circuitry 120 is configured to process the input signal and generate the output signal. The IC 100, for example, may be an analog-to-digital converter wherein the import port 110 receives an analog signal that is processed by the logic circuitry 120 to convert the received analog signal to a digital signal that is provided as the output signal at the output port 130.

The PLL 140 is configured to generate an output signal ($f_{out}$) that is used as a clock signal by the logic circuitry 120. The output signal $f_{out}$ has a frequency that is a multiple of an input reference signal ($f_{ref}$) in a manner that synchronizes (or locks) the relationship between the phases and frequencies of the input reference signal $f_{ref}$ and the output signal $f_{out}$. The PLL 140 includes a phase detector 141, a voltage tuner 142, a VCO 146 having a voltage tune line 148 and a programmable frequency divider 149. The PLL 140 employs the voltage tuner 142 to convert (transduce) an input frequency, the input reference signal $f_{ref}$, to a control voltage that the VCO 146 converts back to a frequency, the output signal $f_{out}$, which is divided-down by the programmable frequency divider 149 and then compared to the input reference signal $f_{ref}$.

The phase detector 141 is configured to receive the input reference signal $f_{ref}$ and the output signal $f_{out}$ and convert the phase difference therebetween to a PWM error signal. The programmable frequency divider 149 divides the output signal $f_{out}$ down for input back to the phase detector to complete the loop. The input reference signal $f_{ref}$, for example, may be about 20 MHz and the VCO 146 may operate at 240 MHz. As such, the programmable frequency divider 149 may be a divide-by-twelve frequency divider that divides the output signal $f_{out}$ for comparison to the input reference signal $f_{ref}$. The phase detector 141 and the programmable frequency divider 149 may be conventional components typically included in PLL. One skilled in the art will understand that the PLL 140 may include additional circuitry or components typically included in a PLL which are not illustrated or discussed.

The voltage tuner 142 is configured to receive the PWM error signal and provide a tuning voltage on the voltage tune line 148 to drive the VCO 146. The voltage tuner 142 may include a conventional charge pump and lag lead loop filter to generate the tuning voltage. Instead of a charge pump, in other embodiments the voltage tuner 142 may include an active compensation network having an operational amplifier to provide the tuning voltage. For example, the voltage tuner 142 may be an active compensation network disclosed as part of an active compensation PLL in U.S. Pat. No. 6,611,176, issued on Aug. 26, 2003 and entitled "Method and Apparatus for Two Zeros/Two Poles Active Compensation Phase Locked Loops," incorporated herein by reference in its entirety.

The VCO 146 receives the tuning voltage via the voltage tune line 148. The VCO 146 may include an odd number of ring-coupled delay elements (not shown) with each delay element including an inverter. The inverter in each of the delay elements includes a power supply line coupled to the voltage tune line 148, and a feedback path having a gain-attenuating transistor with a gate thereof coupled to the voltage tune line 148. The VCO 146 converts the tuning voltage on the voltage tune line 148 to an output phase that reduces the phase and frequency difference between the input reference signal $f_{ref}$ and the output signal $f_{out}$. An embodiment of a VCO, having delay elements with inverters, employable in the PLL 140 is discussed in more detail with respect to FIG. 2. In other embodiments, delay elements may use other logic devices besides inverters. For example, RS-latch delay elements may be used as disclosed in part of U.S. Patent Publication No. 2006/0012414, filed on Jul. 15, 2004 and entitled "Circuit and Method for Generating a Polyphase Clock Signal and System Incorporating the Same," incorporated herein by reference in its entirety. As such, an even number of delay elements can be used by the VCO 146. A feedback path having a gain-attenuating transistor with a gate thereof coupled to the voltage tune line may also be used with the RS-latch delay elements.

FIG. 2 illustrates a schematic diagram of an embodiment of a VCO 200 constructed according to the principles of the disclosure. The VCO 200 includes a ring oscillator 210 a voltage tune line 250 and a level shifter 260.

The ring oscillator 210 includes three delay elements 220, 230, 240, configured in a ring. Each of the delay elements 220, 230, 240, has a gain of about 35 dB. For simplicity, the delay element 220 is selected to represent each of the delay elements 220, 230, 240. Delay element 220 includes an inverter 222, a power supply line 223 and a feedback path 224. The power supply line 223 is coupled to the voltage tune line 250. The feedback path 224 includes a transistor 226 with a gate thereof coupled to the voltage tune line 250. The size of the transistor 226 is selected to reduce the gain of the delay element 220 and provide an enhanced oscillation frequency range for the ring oscillator 210.

The 35 dB gain is inherent due to the CMOS logic used in the delay elements 220, 230, 240. Employing other types of logic in fabricating the delay elements 220, 230, 240, would typically result in a different inherent gain. Regardless of the amount of the inherent gain associated with a delay element, the feedback path 224 with a transistor 226 can be used to reduce the inherent gain of a delay element.

The inverter 222 includes a p-channel transistor and an n-channel transistor coupled together with the output of the delay element therebetween. The p-channel transistor is coupled to the voltage tune line 250 via the power supply line 223. The n-channel transistor of the inverter 222 is connected to ground. The feedback path 224 provides a path from the output of the inverter 222 to the input thereof.

The VCO 200 may be fabricated in silicon at a process node of 65 nm for an output frequency of 240 MHz. In such an embodiment, the p-channel transistor may have a width of 100 μm, the n-channel transistor of the inverter 222 may have a width of 33 μm and the transistor 226 may have width of 6 μm. Each of these transistors may have a length of 0.6 μm.

The feedback path 224 provides a path between the output of the delay element 220 through the transistor 226 to the input of the delay element 220. The transistor 226 is a gain-attenuating transistor that reduces the gain of the delay element 220. The transistor 226 may be an n-channel transistor that reduces the gain of the delay element 220 by or about 15 dB. Thus, the transistor 226 can be used to provide a total gain of 20 dB for the delay element 220 (35 dB–15 dB).

The level shifter 260 is configured to receive the output from the ring oscillator 210 and condition the output for feedback, such as to a phase detector of a PLL. For example, the VCO 200 may be coupled to a programmable frequency divider that receives the output from the VCO 200 and provides a divided-down output to the phase detector. A programmable frequency divider (e.g., the programmable frequency divider 149 of FIG. 1) may require an input voltage of about 1.2 volts. The output swing of the ring oscillator 210, however, may be about 0.5 volts to about 1.2 volts. The level shifter 260 can receive the output of the ring oscillator 210 and convert the lower voltage levels to a full logic level of about 1.2 volts to be delivered to the programmable frequency divider 149 of FIG. 1. Other embodiments may not require a voltage conditioner or may require a type of voltage conditioner other than a level shifter.

The level shifter 260 includes a first p-channel transistor P1, a second p-channel transistor P2, a first n-channel transistor N1 and a second n-channel transistor N2. As noted above, the VCO 200 may be fabricated in silicon at a process node of 65 nm for an output frequency of 240 MHz. At the 65 nm process node, the level shifter 260 may be fabricated with P1 having a width of 4 μm, P2 having a width 32 μm, N1 having a width of 8 μm and N2 having a width 16 μm. Each of these transistors may have a length of 0.07 μm.

The output period of the ring oscillator 210 is represented by Equation 1 presented below. The output period is based on the amount of delay for each of the delay elements 220, 230, 240, and the number of delay elements, viz.:

$$T_o = 2MT_d, \quad (1)$$

where
M=the number of stages (delay elements),
$T_d$=delay for each stage.

For single ended gates, such as delay elements 220, 230, 240, the number of inverters must be odd since one round-trip around the ring oscillator 210 produces 180° of phase shift. The total phase shift through the VCO 200 must be 360° with a gain of unity to meet the criterion for stable oscillation. Consequently two round-trips occur of each period of oscillation. The factor difference of two in phase shift is represented by the factor of two in Equation 1.

Varying the delay term, $T_d$, in Equation 1 varies the output frequency of the VCO 200 ($f_o = 1/T_o$). Each of the delay elements 220, 230, 240, provides a phase shift of 60° for the ring oscillator 210. In the illustrated embodiment, the VCO has an output frequency of 240 MHz and a period of 4.16 ns. As such, each of the delay elements 220, 230, 240, has a delay of 694 ps.

The voltage tune line 250 receives the tuning voltage from a voltage tuner. For example, the voltage tune line 250 may be coupled to a port control from an operational amplifier of a voltage tuner in a PLL. The power supply line (e.g., power supply 224) of each of the delay elements 220, 230, 240, connects to the voltage tune line 250. As the tuning voltage on the voltage tune line 250 changes, the delay of each element 220, 230, 240, and the channel resistance of the transistor in the feedback path (e.g., the transistor 226 in the feedback path 224) also changes. Consequently, changing the delay of each of the delay elements 220, 230, 240 linearly changes the output frequency of the VCO 200.

When the tuning voltage on the voltage tune line 250 decreases, the delay in the delay elements 220, 230, 240, increases. This results in a decrease in the frequency of oscillation. A decrease in the tuning voltage also increases the feedback of the transistor 226 which maintains the 15 dB decrease in gain at lower frequencies.

A change in the tuning voltage also reduces the maximum frequency response of the VCO 200. One advantage of reducing the maximum frequency response is reducing the sensitivity of the VCO 200 to high frequency signals and reducing the excitation of other oscillating modes. The logic swing of the VCO 200 may also be changed as a result of the tuning voltage changing. Decreasing the tune voltage reduces the swing of the output voltage of the VCO 200. Consequently, high voltage swings occur when the output frequency is the highest and low voltage swings occur for low frequencies which reduces power consumption. The level shifter 260 can be used to convert the low frequency low voltage swings to full logic levels. Continuing to decrease the tuning voltage will stop the ring oscillator 210 from oscillating at a threshold voltage $V_t$ of about 0.5 volts.

Figure 3A:
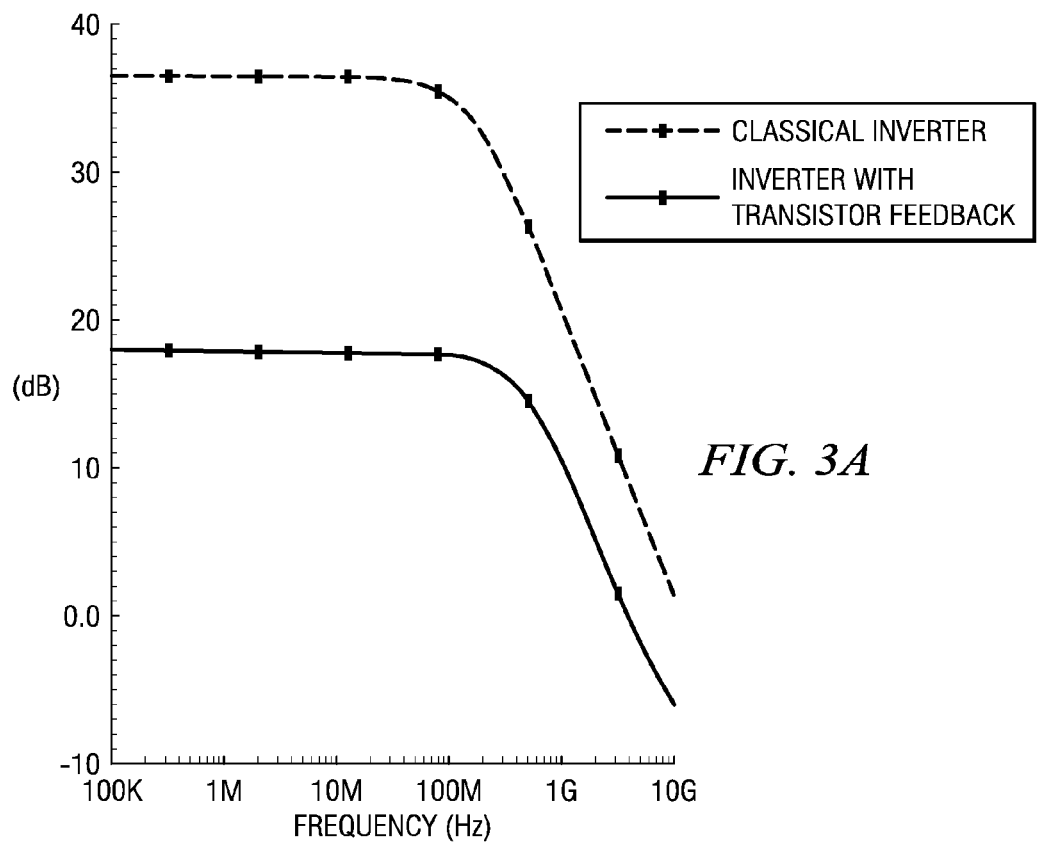
FIG. 3A illustrates a graph representing the gain of an embodiment of a delay element with an inverter having a transistor in the feedback path versus a delay element having a classical inverter.
Figure 3B:
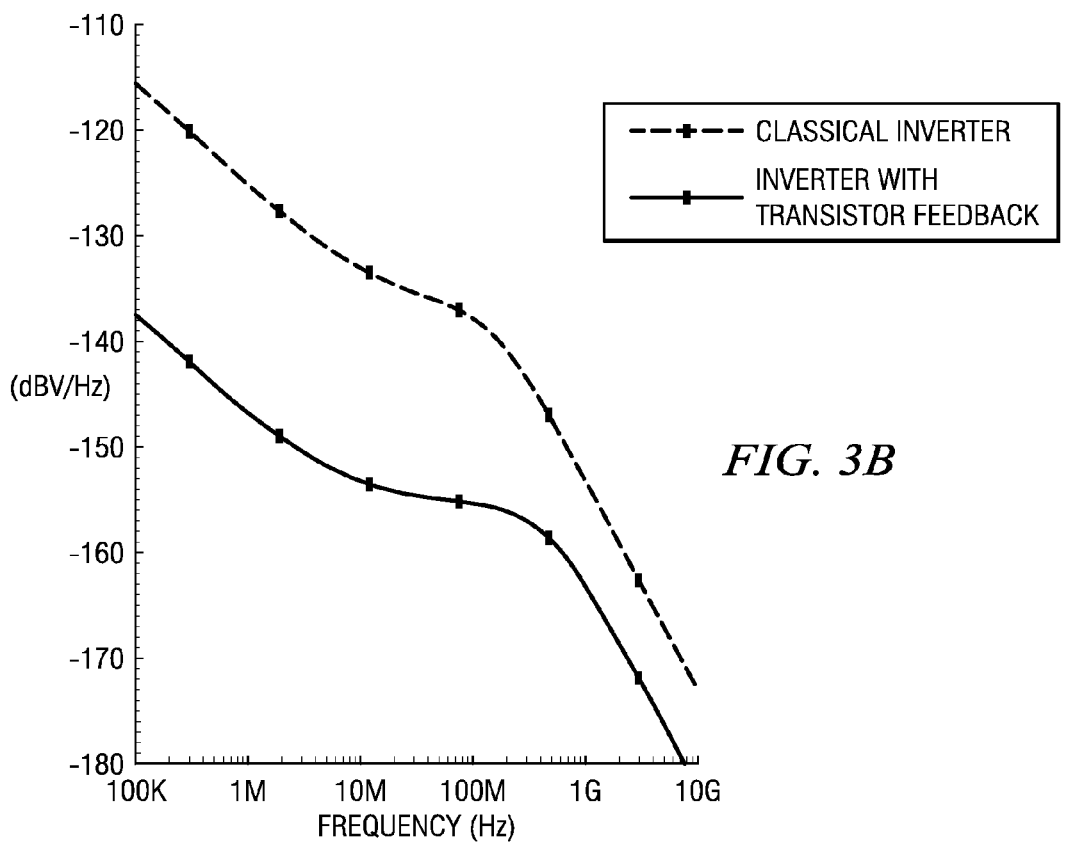
FIG. 3B illustrates a graph representing the output noise analysis of an embodiment of a delay element with an inverter having a transistor in the feedback path (i.e., transistor feedback) versus a delay element having a classical inverter.

FIG. 3A illustrates a graph representing the gain of an embodiment of a delay element with an inverter having a transistor in the feedback path versus a delay element having a classical inverter. FIG. 3B illustrates a graph representing the output noise analysis of an embodiment of a delay element with an inverter having a transistor in the feedback path (i.e., transistor feedback) versus a delay element having a classical inverter. Both graphs were generated using the SPICE program to do AC analysis of a simulated delay element such as delay element 220 in FIG. 2.

In FIG. 3A, gain is represented on the y-axis in dB with frequency represented on the x-axis in Hertz. The top waveform (classical inverter) shows a 35 dB gain from 100 kHz to 30 MHz for a delay element without transistor feedback. The bottom waveform (transistor feedback) shows a gain 17 dB less (18 dB gain) from 100 kHz to 100 MHz for a delay element with transistor feedback.

In FIG. 3B, output noise of a delay element is represented in dBV/Hz. The y-axis represents the noise in dBV/Hz and the x-axis represents the frequency in Hertz. A delay element without transistor feedback (classical) has a −135 dBV/Hz flat noise response from 6-400 MHz and a 1/f noise response from 6 MHz to −115 dBV/Hz at 100 kHz. A delay element with transistor feedback has a −153 dBV/Hz flat noise response from 6-400 MHz and a 1/f noise response from 6 MHz to −136 dBV/Hz at 100 kHz. Thus, a delay element having transistor feedback may produce 18 dB less noise at the output of the delay element.

Phase noise of an oscillator with and without inverters having transistor feedback may be computed employing Leeson's model (see, e.g., page 65 of Goldman, "Phase-Locked Loop Engineering Handbook for Integrated Circuits," Artech House, Boston, 2007, incorporated herein by reference in its entirety). For example, consider a ring oscillator, such as the ring oscillator 210 in FIG. 2, with an output frequency of 240 MHz, an output swing of 0.8 volts, a corner flicker frequency of 6 MHz as shown in FIG. 3A and a loaded Q of 1 since essentially no energy is stored from one cycle to the next. Computing the phase noise for the ring oscillator indicates that the phase noise for a ring oscillator with delay elements having a transistor feedback maintains the 18 dB less output noise of the delay element in FIG. 3A as compared to a ring oscillator with delay elements not having transistor feedback. The 18 dB reduction in noise results gives a phase noise plot close to an oscillator that has an LC tank with a Q of 10 and a delay element gain of 35 dB. This comparable phase noise level achievement can result in a reduction of the large integrated circuit area needed for an inductor by using a delay element having an inverter with transistor feedback.

Employing a transistor in the feedback path of the delay elements offers several advantages to using a resistor in the feedback path. For example, employing the transistor improves the operating range of the delay elements. Using a resistive feedback instead of transistor feedback may result in a smaller voltage range of 0.9-1.2 volts which corresponds to a VCO frequency range of 220-290 MHz. This 70 MHz range can be too narrow for variations due to process and temperature. In comparison, a transistor feedback had a 0.5-1.2 volt voltage tune range for a 40-320 MHz oscillation frequency range and is less sensitive to process and temperature variations.

Those skilled in the art to which the disclosure relates will appreciate that other and further additions, deletions, substitutions and modifications may be made to the described embodiments without departing from the scope of the disclosure.

What is claimed is:
1. A phase-locked loop (PLL), comprising:
 a phase detector configured to generate an error signal based on a reference frequency and an output frequency of said PLL;
 a voltage tuner configured to receive said error signal and generate a tuning voltage; and
 a voltage controlled oscillator configured to provide said output frequency, including:
 a voltage tune line configured to receive said tuning voltage, and
 ring-coupled delay elements, each including:
  is feedback path having a gain-attenuating transistor with a gate thereof being coupled to said voltage tune line.

2. The PLL as recited in claim 1 wherein said voltage controlled oscillator includes an odd number of said delay elements, and each of said delay elements includes an inverter having a power supply line being coupled to said voltage tune line.

3. The PLL as recited in claim 2 wherein an output of said delay elements has a range between about 0.5 volts to about 1.2 volts.

4. The PLL as recited in claim 1 wherein said transistor is an n-channel transistor.

5. The PLL as recited in claim 1 wherein said transistor attenuates an inherent gain of said delay element each by about 15 dB.

6. The PLL as recited in claim 1 wherein said transistor has an aspect ratio of about ten.

7. The PLL as recited in claim 1 wherein said PLL is fabricated at a process node of 65 nm.

8. A voltage-controlled oscillator (VCO), comprising:
   a voltage tune line configured to receive a tuning voltage for said VCO; and
   an odd number of ring-coupled delay elements, each including:
      an inverter having a power supply line being coupled to said voltage tune line, and
      a feedback path having a gain-attenuating transistor with a gate thereof being coupled to said voltage tune line.

9. The VCO as recited in claim 8 wherein said odd number is three.

10. The VCO as recited in claim 9 including a level shifter coupled to said delay elements and configured to receive an output thereof, said level shifter configured to convert said output of said delay elements to a logical level to provide an output for said VCO.

11. The VCO as recited in claim 10 wherein said output of said delay elements has a range between about 0.5 volts to about 1.2 volts.

12. The VCO as recited in claim 8 wherein said transistor is an n-channel transistor.

13. The VCO as recited in claim 8 wherein said transistor attenuates an inherent gain associated with said delay element each by about 15 dB.

14. The VCO as recited in claim 8 wherein said transistor has an aspect ratio of about ten.

15. An integrated circuit, comprising:
   an input port configured to receive an input signal;
   logic circuitry configured to process said input signal and generate an output signal;
   an output port configured to provide an external interface for said output signal; and
   a phase-locked loop configured to generate a clock signal for said logic circuitry, said phase-locked loop having a voltage controlled oscillator (VCO), including:
      a voltage tune line configured to receive a tuning voltage for said VCO; and
      ring-coupled delay elements, each including:
         a feedback path having a gain-attenuating transistor with a gate thereof being coupled to said voltage tune line.

16. The integrated circuit as recited in claim 15 wherein said VCO has three delay elements.

17. The integrated circuit as recited in claim 16 including a level shifter coupled to said delay elements and configured to receive an output thereof, said level shifter configured to condition said output of said delay elements to provide a VCO output.

18. The integrated circuit as recited in claim 17 wherein said transistor is an n-channel transistor.

19. The integrated circuit as recited in claim 18 wherein said n-channel transistor has an aspect ratio of about ten.

20. The integrated circuit as recited in claim 15 wherein said transistor attenuates gain associated with said delay element each by about 15 dB.

21. The integrated circuit as recited in claim 15 wherein said VCO has an even number of delay elements.

\* \* \* \* \*